Dec. 2, 1969 W. G. CROUSE 3,482,188

VARIABLE FREQUENCY PHASE SHIFT OSCILLATOR UTILIZING DIFFERENTIAL AMPLIFIERS

Filed April 15, 1968

INVENTOR
WILLIAM G. CROUSE

BY Delbert C. Thomas

ATTORNEY

United States Patent Office 3,482,188

Patented Dec. 2, 1969

3,482,188

VARIABLE FREQUENCY PHASE SHIFT OSCILLATOR UTILIZING DIFFERENTIAL AMPLIFIERS

William G. Crouse, Raleigh, N.C., assignor to International Business Machines Corporation, Armonk, N.Y., a corporation of New York Filed Apr. 15, 1968, Ser. No. 721,453

Int. Cl. H03b 5/20

U.S. Cl. 331—135 4 Claims

ABSTRACT OF THE DISCLOSURE

A phase shift oscillator using only resistive-capacitive elements as input filters for two differential amplifier circuits can provide a stable, electronically switchable oscillator. Such an oscillator can be of small size and power and still provide a set of stable frequencies with a well regulated amplitude output.

Introduction

This disclosure relates to a type of oscillator using two amplifiers each with a frequency sensitive phase shifting input circuit, the input circuits responding to a frequency change with opposite phase shifts. More particularly, two differential amplifiers are provided, each of which has as an input, the output of the other through a resistor-capacitor phase shift network. Such a combination will oscillate at the frequency which receives a zero phase shift over the circuit.

Phase shift oscillators are not generally new but known circuits have the disadvantage of using inductive components which are unduly large for audio frequencies, require adjustable capacitor circuits and/or are not suitable for electronic frequency switching by semiconductor circuits. The herein described circuit uses no inductive components, having only resistance capacitive frequency sensitive circuits, has frequency shifting by changing resistance values only and can be selected for frequency by energization of a transistor circuit.

The foregoing and other objects, features and advantages of the invention will be apparent from the following more particular description of a preferred embodiment of the invention, as illustrated in the accompanying drawings.

Detailed specification

Two of the requirements for sustained oscillation in an oscillatory circuit are that the loop gain from input to output be unity and that the net phase shift around the loop be equal to zero. The loop gain in a ring of amplifiers is the product of the gains of the separate amplifiers. In this device, each amplifier is an operational type amplifier which has its input and feedback circuits adjusted to give a one to one ratio between input and output signal amplitudes and the loop gain is for all practical purposes equal to unity. Since the circuit will oscillate at the frequency for which the net loop phase shift is zero, each operational amplifier is constructed as a differential amplifier and the inputs are made to give a frequency sensitive phase shift. The phase shift for the amplifiers can be set for either a leading or a lagging phase shift and it is necessary that at least one amplifier with a leading phase shift and at least one with a lagging phase shift be used.

Figure 1:
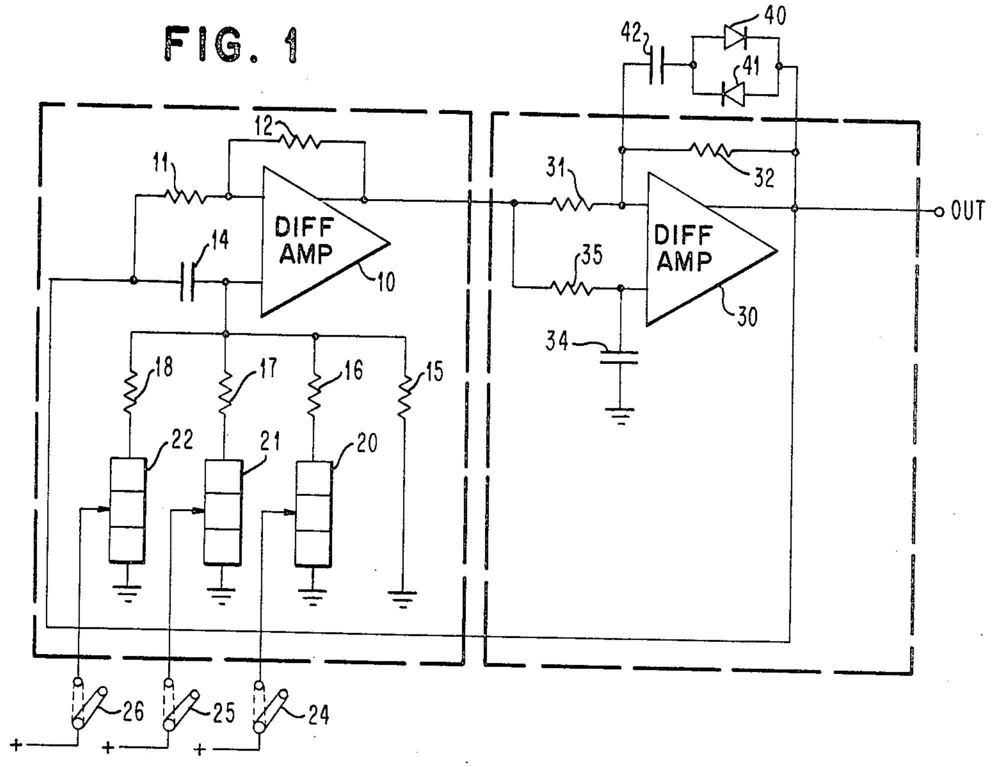
FIGURE 1 is a schematic diagram of the oscillator of this disclosure.

Referring now to FIGURE 1, the oscillatory circuit includes two substantially similar sections. In the first section, a differential amplifier 10 of conventional construction is the active element. Such differential amplifiers are commercially available and are basically a very high gain, i.e., 10,000 or more, direct coupled amplifier with no appreciable frequency sensitivity from DC to a frequency above the amplifiers design limit. The output of the amplifier will be of a polarity opposite to that of the input. The differential feature is provided in the input circuits which are so set up that the signal on one input, usually the lower of two indicated inputs, is subtracted from the signal on the upper input. Such subtraction of two signals has been done in many well known ways among which are an inverter circuit for the lower input, or application of the two inputs respectively to the base and emitter circuits of a transistor.

Reduction of the gain of differential amplifier 10 to unity is accomplished by placing a resistor 11 between the signal source and the upper input of amplifier 10 and by connecting an equal resistor 12 from the output of amplifier 10 to its upper input. This feedback circuit will insure that the output signal is the same magnitude as the input signal but of opposite polarity. The lower input of amplifier 10 is connected through a capacitor 14 to the signal input and by a variable resistance to a signal ground. The variable resistance is used for changing the oscillatory frequency and consists of a fixed resistor 15 and a number, here shown as 3, of resistors 16, 17, and 18 which are shuntable across resistor 15 by individual transistors 20, 21, and 22. The collectors of transistors are connected individually to one end of their associated resistor 16, 17, or 18, the transistor emitters are all connected to the signal ground and the bases are individually connected through switches 24, 25, and 26 to a voltage source. The lowest frequency of oscillation will be determined by resistor 15 alone and shunting of one or more of resistors 16 to 18 across resistor 15 will increase the oscillation frequency as will be explained later. If a continuously variable frequency is desired, it is possible to use a single variable resistor in place of the resistors 15–18 or a field effect transistor controlled by a variable voltage may be used as the variable resistor.

The second section of the oscillator also has a differential amplifier 30 as its active element. This amplifier is the same as amplifier 10 and has a resistor 31 connected from the output of amplifier 10 to its upper input and a feedback resistor 32 from its output to its upper input. The lower input is different from that of amplifier 10 and has a resistor 35 connected between the input and the output of amplifier 10. A capacitor 34 is connected from the lower amplifier input to the signal ground for the output of amplifier 10. The output of the amplifier 30 is the signal source for amplifier 10 and is connected to resistor 11 and capacitor 14.

As an optional feature for improving stability of oscillation, a pair of oppositely poled diodes 40 and 41 are connected from the output of amplifier 30 to one lead of a capacitor 42 whose other lead is connected to the upper input of amplifier 30. If this circuit is used, the loop gain of the two amplifiers is adjusted to be slightly greater than unity which will cause the output amplitude to be increasing. If the diodes 40 and 41 are of silicon or are a Zener type or the like, they will not start conduction until the output voltage reaches the limited amplitude and they will then act as a feedback path to cut back on the amplitude. Capacitor 42 is used to pass the AC signal component only and may be dispensed with if diodes 40 and 41 are suitably matched and there is no DC voltage developed across resistor 32.

Figure 2:
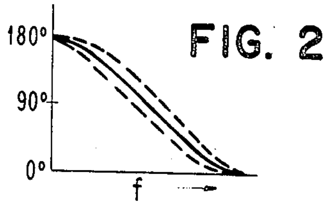
FIGURE 2 is a graph showing the frequency-phase relationship between the input and output signals of a first oscillator section.

In the operation of the circuit, the output of amplifier 10 will have a component effectively 180° from the input signal through resistor 11 and will have a second component equal to the signal on the lower input. This second component will have a variable phase shift from the input signal depending upon the oscillation frequency. As is indicated in the solid line of FIGURE 2, the resultant phase shift between the output of amplifier 10 and the input signal to the section will vary from +180° for a DC signal, none of which passes through capacitor 14, through +90° when the impedances of the capacitor 14 and the variable resistance are equal, to approximately 0° at high frequencies when the impedance of capacitor 14 is very low. The effective input signal to differential amplifier 10 has a frequency dependent variance from a signal of a unit magnitude through resistor 11 to the upper input to twice that signal through capacitor 14 to the lower input. The output phase change is effectively twice the phase change in the lower input circuit. By changing the effective resistance through switching conductance of transistors 20, 21, and 22, the relative phase change with frequency can be altered as indicated by the dotted lines of FIGURE 2.

Figure 3:
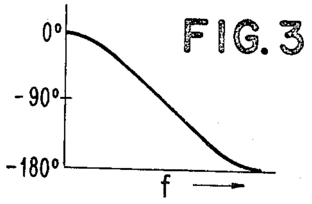
FIGURE 3 is a graph similar to FIGURE 2 for a second oscillator section.
Figure 4:
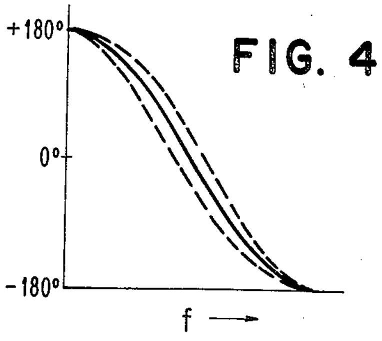
FIGURE 4 is a frequency-phase graph for the circuit of FIGURE 1.

FIGURE 3 is a graph of the phase angle change with frequency of the second portion of the oscillator circuit. It will be noted that at low frequency, the capacitor 34 is ineffective so that the two inputs are in phase and the output phase will be equal to the input phase. As frequency increases, the output phase will begin to lag the input phase until at high frequencies, it will lag by about 180°. FIGURE 4 is a combined graph of the frequency-phase shift relationship of the overall circuit from the input signal of the first section to the output of the second section and is in effect, a combination of the graphs of FIGURES 1 and 2. As is shown, the phase shift varies from a leading phase of about 180° at a DC input to a lagging phase of about 180° at a high frequency. When the output is fed back to the input, such a circuit will oscillate at the frequency for which the resultant phase shift is equal to zero. The dotted line graphs of FIGURE 4 indicate other frequency-phase shift relationships available by switching in different effective values of the parallel resistors 15–18. It will be noted that the 0° phase shift of these curves occurs at different frequencies indicating that the oscillatory frequency can be altered by a change in the effective resistance from the lower input of amplifier 10 to the input signal ground.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A phase shift oscillator comprising:

a first portion including a differential amplifier circuit having an overall signal ratio of about unity and having a 180° leading phase shift of the output signal relative to the input for DC signals, said differential amplifier also having a frequency sensitive input circuit to decrease the phase shift of the output signal relative to the input signal toward 0° as the frequency of the input signal increases, a second portion including a differential amplifier circuit having an overall signal ratio of about unity and having input circuits to control generation of a small lagging phase shifted output relative to the input signal for low frequency signals with the lagging phase shift increasing for higher frequencies, and connections between the output of each portion and the input of the other portion whereby the circuit will oscillate at a frequency such that the leading phase shift of said first portion is equal in angle to the lagging phase shift of the second of said sections.

2. The oscillatory circuit as set out in claim 1 in which each differential amplifier has a pair of input circuits having opposite effects on the output signal, a resistive feedback connection from the output of each differential amplifier to one of said input circuits, a resistive connection from said one input circuit to the output of the other differential amplifier and, a connection having a frequency dependent phase shift from the other of said input connections to said output of said other differential amplifier.

3. The oscillatory circuit as set out in claim 2 in which one of said frequency dependent phase shift connections comprises a capacitor connected from one of said differential amplifier outputs to said other input circuit of said other differential amplifier with a first resistor from said input circuit to signal ground and, the other frequency dependent phase shift connection comprises a second resistor connected from the output of the other of said differential amplifiers to said other input of said one differential amplifier together with a capacitor from said input to signal ground.

4. The oscillator as claimed in claim 3 and including a plurality of resistors connectable in parallel with said first resistor from said other input terminal of said other differential amplifier and, means to connect one or more of said resistors in parallel with said first resistor to alter the frequency of oscillation of said circuit.

References Cited

UNITED STATES PATENTS

| | | | |
|---|---|---|---|
| 2,902,656 | 9/1959 | Soffel | 331—135 |
| 3,254,311 | 5/1966 | Collins et al. | 331—135 X |
| 3,289,102 | 11/1966 | Hayashi | 331—137 X |

ROY LAKE, Primary Examiner

S. H. GRIMM, Assistant Examiner

U.S. Cl. X.R.

331—108, 177